(12) United States Patent
Koehler et al.

(10) Patent No.: US 12,048,114 B2
(45) Date of Patent: Jul. 23, 2024

(54) AIR CONDITIONER FOR SEALED ENCLOSURES

(71) Applicant: Hoffman Enclosures Inc., Anoka, MN (US)

(72) Inventors: Michael Koehler, Ramsey, MN (US); Randal Schroeder, Champlin, MN (US); Michael Woods, Elk River, MN (US); Jeff Thibedeau, Robinsdale, MN (US); Joseph Ricke, Arden Hills, MN (US)

(73) Assignee: Hoffman Enclosures Inc., Anoka, MN (US)

( * ) Notice: Subject to any disclaimer, the term of this patent is extended or adjusted under 35 U.S.C. 154(b) by 98 days.

(21) Appl. No.: 17/718,873

(22) Filed: Apr. 12, 2022

(65) Prior Publication Data
US 2022/0330451 A1    Oct. 13, 2022

Related U.S. Application Data

(60) Provisional application No. 63/173,857, filed on Apr. 12, 2021.

(51) Int. Cl.
*H05K 7/20*    (2006.01)

(52) U.S. Cl.
CPC ......... *H05K 7/202* (2013.01); *H05K 7/20136* (2013.01); *H05K 7/20309* (2013.01); *H05K 7/20318* (2013.01)

(58) Field of Classification Search
CPC .... H05K 7/20136; H05K 7/206; H05K 7/202; H05K 7/20318; H05K 7/20309; F24F 1/24
See application file for complete search history.

(56) References Cited

U.S. PATENT DOCUMENTS

| | | | |
|---|---|---|---|
| 3,559,728 A | | 2/1971 | Lyman et al. |
| 3,838,579 A | | 10/1974 | Ballard |
| 4,027,498 A | * | 6/1977 | Fessler .................. F24F 1/0323 62/263 |

(Continued)

FOREIGN PATENT DOCUMENTS

| | | |
|---|---|---|
| CN | 201281409 Y | 7/2009 |
| CN | 201407751 Y | 2/2010 |

(Continued)

*Primary Examiner* — Frantz F Jules
*Assistant Examiner* — Martha Tadesse
(74) *Attorney, Agent, or Firm* — Quarles & Brady LLP

(57) ABSTRACT

An air conditioner for an enclosure that can include a housing that partly defines an ambient air exchange cavity and a tub that further defines the ambient air exchange cavity and partly defines a cooling cavity. The tub can support a first heat exchanger within the ambient air exchange cavity, and a second heat exchanger and a fan within the cooling cavity. The second heat exchanger can be included in a coolant flow loop with the first heat exchanger and the fan can move air across the second heat exchanger and into the inlet of the enclosure. The second heat exchanger can be located above the fan. A fluid trap can be provided below the second heat exchanger and adjacent the fan to capture condensate from the second heat exchanger and can direct the condensate into the ambient air exchange cavity for disposal.

20 Claims, 12 Drawing Sheets

(56) References Cited

U.S. PATENT DOCUMENTS

| | | | |
|---|---|---|---|
| 4,202,389 A | 5/1980 | Ewald | |
| 4,949,867 A | 8/1990 | Immel | |
| 5,035,281 A | 7/1991 | Neuenfeldt et al. | |
| 5,657,641 A * | 8/1997 | Cunningham | H05K 7/20681 |
| | | | 62/263 |
| 5,738,166 A | 4/1998 | Chou | |
| 6,039,111 A | 3/2000 | Kawaguchi et al. | |
| 6,119,767 A | 9/2000 | Kadota et al. | |
| 6,134,109 A | 10/2000 | Muller et al. | |
| 6,139,361 A | 10/2000 | Przilas et al. | |
| 6,345,511 B1 | 2/2002 | Esty et al. | |
| 6,643,130 B1 | 11/2003 | DeMarchis et al. | |
| 7,132,601 B1 | 11/2006 | Seff | |
| 7,178,354 B2 | 2/2007 | Bretschneider et al. | |
| 7,534,167 B2 | 5/2009 | Day | |
| 7,867,070 B2 | 1/2011 | Day | |
| 7,878,889 B2 | 2/2011 | Day | |
| 8,157,626 B2 | 4/2012 | Day | |
| 8,251,136 B2 | 8/2012 | Shibata et al. | |
| 8,827,778 B2 | 9/2014 | Hartmann | |
| 9,392,733 B2 | 7/2016 | Day | |
| 10,111,360 B2 | 10/2018 | Perrin et al. | |
| 10,219,417 B2 | 2/2019 | Juan et al. | |
| 10,292,305 B2 | 5/2019 | Greubel et al. | |
| 10,440,856 B2 | 10/2019 | Greubel et al. | |
| 10,448,544 B1 | 10/2019 | Kleinecke et al. | |
| 10,820,453 B2 | 10/2020 | Zhu et al. | |
| 10,912,237 B2 | 2/2021 | Elliott | |
| 2005/0225936 A1 * | 10/2005 | Day | H05K 7/20745 |
| | | | 361/679.47 |
| 2007/0227181 A1 | 10/2007 | Leon et al. | |
| 2007/0296315 A1 | 12/2007 | Francisquini | |
| 2014/0125161 A1 * | 5/2014 | Cloran | H02K 5/10 |
| | | | 310/52 |
| 2019/0053399 A1 * | 2/2019 | Greubel | H05K 7/202 |
| 2019/0327863 A1 | 10/2019 | Kleinecke et al. | |
| 2020/0161213 A1 | 5/2020 | Yamaura | |
| 2020/0329586 A1 | 10/2020 | Fuller et al. | |

FOREIGN PATENT DOCUMENTS

| | | | |
|---|---|---|---|
| CN | 207706554 U | 8/2018 | |
| CN | 110785067 A | 2/2020 | |
| CN | 211295747 U | 8/2020 | |
| CN | 111642105 A | 9/2020 | |
| CN | 212320042 U | 1/2021 | |
| DE | 3305126 A1 | 8/1984 | |
| DE | 3714727 A * | 11/1988 | F25D 21/14 |
| DE | 3714727 A1 | 11/1988 | |
| DE | 4313022 C1 | 5/1994 | |
| DE | 19515122 A1 | 10/1996 | |
| DE | 19641552 C1 | 12/1997 | |
| DE | 19701100 A1 | 7/1998 | |
| DE | 19842561 A1 | 4/2000 | |
| DE | 10156701 A1 | 6/2003 | |
| DE | 102004030785 B3 | 11/2005 | |
| DE | 102008050376 A1 | 4/2010 | |
| EP | 0823195 B1 | 11/1998 | |
| EP | 0846354 B1 | 5/1999 | |
| GB | 2254735 B | 10/1992 | |
| IN | 106535555 A | 3/2017 | |
| WO | 2016/165475 A1 | 10/2016 | |

* cited by examiner

AIR CONDITIONER FOR SEALED ENCLOSURES

CROSS-REFERENCE TO RELATED APPLICATIONS

This application claims priority to U.S. Provisional Patent Application No. 63/173,857, filed Apr. 12, 2021, titled "Air Conditioner for Sealed Enclosures," the entirety of which is incorporated herein by reference.

STATEMENT REGARDING FEDERALLY SPONSORED RESEARCH

Not applicable.

BACKGROUND

Enclosures are used in various industries to conceal and retain different types of supplies, which can include electrical components. In some cases, the electrical components retained within an enclosure must be maintained at a particular temperature (e.g., below a particular maximum temperature). Thus, considering also that the electrical components themselves generally produce heat, in order for the electrical components to function ideally, produced and ambient heat may sometimes be removed by an air conditioning system.

SUMMARY

Some embodiments of the disclosure provide an air conditioner for an enclosure having an interior volume accessible via an inlet and an outlet. The air conditioner can include a housing that partly defines an ambient air exchange cavity and a tub that further defines the ambient air exchange cavity and partly defines a cooling cavity. The tub can support a first heat exchanger (e.g., a condenser) disposed within the ambient air exchange cavity, a first fan to move air across the first heat exchanger, and a second heat exchanger (e.g., an evaporator) and a second fan disposed within the cooling cavity. The second heat exchanger can be included in a coolant flow loop with the first heat exchanger and the second fan can move air across the second heat exchanger and into the inlet of the enclosure. The second heat exchanger can be located above the second fan. Further, a condensed water coil defining a fluid trap can be provided below the second heat exchanger and adjacent the second fan to capture condensate from the second heat exchanger and can direct the condensate into the ambient air exchange cavity for disposal. When assembled to the enclosure, the tub and housing can be arranged to provide solid particle ingress protection for the cooling cavity and liquid ingress protection for the cooling cavity.

Some embodiments of the disclosure provide an air condition for attachment to an enclosure having an interior volume accessible via an inlet and an outlet. The air conditioner can include an ambient air exchange cavity. A tub, which can define a cooling cavity, can be adjacent the ambient air exchange cavity. A first heat exchanger can be disposed within the ambient air exchange cavity and positioned on a first tray coupled to a wall of the tub. A second heat exchanger can be disposed within the cooling cavity and in a coolant flow loop with the first heat exchanger via passage through a first grommet in the wall. A second tray can be disposed below the second heat exchanger to catch condensate falling from the second heat exchanger. A fluid trap can extend downward from the second tray and out of the cooling cavity via passage through a second grommet in the wall into the ambient air exchange cavity and terminating over a third tray. A fan can move air through the cooling cavity, across the second heat exchanger, and into the inlet of the enclosure. The fan can be disposed below the second heat exchanger. The trap can have a trap height greater than an altered level of condensate within the fluid trap created by a pressure differential during a spray down procedure in which the cooling cavity experiences a negative pressure change.

Some embodiments of the disclosure provide an air conditioner for attachment to an enclosure. The air conditioner can include an ambient air exchange cavity with a first heat exchanger. A cooling cavity can be adjacent the ambient air exchange cavity with a second heat exchanger in fluid communication with the first heat exchanger. A fluid drain can be disposed below the second heat exchanger to capture condensate formed by the second heat exchanger and dispose of the condensate into the ambient air exchange cavity. The fluid drain can have a fluid trap that retains the captured condensate therein and can provide solid particle ingress protection for the cooling cavity.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
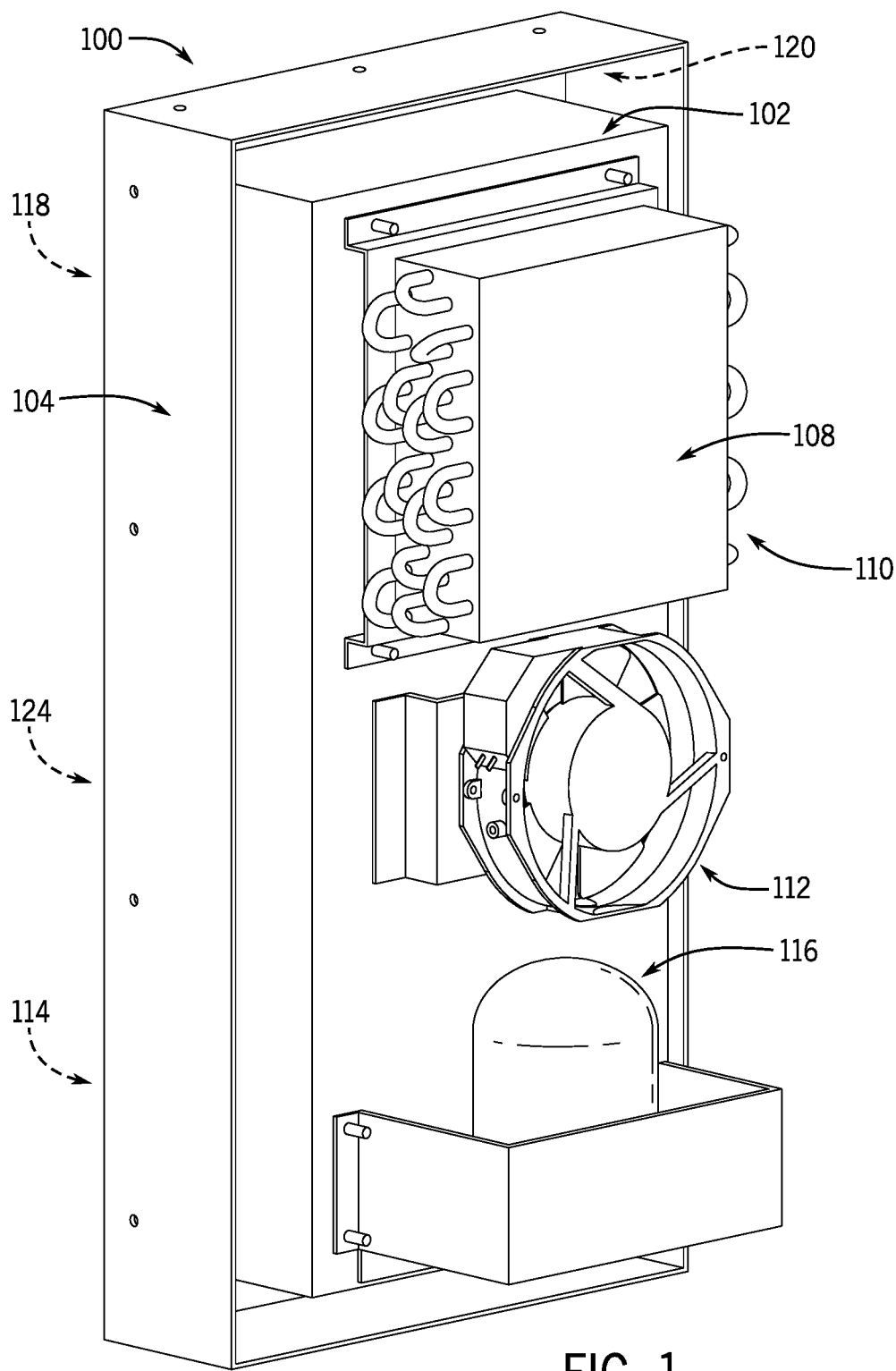
FIG. 1 shows a front isometric partial view of an air conditioner for an enclosure according to an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

As used herein, unless otherwise limited or defined, discussion of particular directions is provided by example only, with regard to particular embodiments or relevant illustrations. For example, discussion of "top," "front," or "back" features is generally intended as a description only of the orientation of such features relative to a reference frame of a particular example or illustration. Correspondingly, for example, a "top" feature may sometimes be disposed below a "bottom" feature (and so on), in some arrangements or embodiments. Further, references to particular rotational or other movements (e.g., counterclockwise rotation) is generally intended as a description only of movement relative a reference frame of a particular example of illustration.

Also as used herein, unless otherwise limited or defined, "integral" and derivatives thereof (e.g., "integrally") describe elements that are manufactured as a single piece without fasteners, adhesive, or the like to secure separate components together. For example, an element stamped, cast, or otherwise molded as a single-piece component from a single piece of sheet metal or using a single mold, without rivets, screws, or adhesive to hold separately formed pieces together is an integral (and integrally formed) element. In contrast, an element formed from multiple pieces that are separately formed initially then later connected together, is not an integral (or integrally formed) element.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As described above, enclosures can retain electrical components, which can generate undesirable heat within the interior volume of the enclosure. In some cases, the surrounding ambient air (e.g., within an indoor facility), even when cooled to relatively low temperatures, cannot provide sufficient heat exchange with the interior volume of the enclosure (e.g., within a sufficient time period). Thus, this generated heat can increase the temperature of the air within the interior volume of the enclosure, which can undesirably impact the performance of the electrical components (e.g., the electrical components slow, become damaged, etc.). Thus, this generated heat—as well as heat transferred into the enclosure from the ambient environment, as needed—may need to be removed from the interior volume of the enclosure. This heat removal can generally be accomplished by configuring an air conditioner to cool the interior volume of the enclosure.

In some industries (e.g., the food and beverage industries) or environments (e.g., hazardous locations), regulatory or operational standards for contaminants (e.g., dust, or other particulates) may allow only extremely low levels of contaminants to be introduced into an enclosure. However, conventional air conditioners for enclosures routinely fail these standards by allowing contaminants (e.g., dust) to pass from the ambient environment and into the interior volume of the enclosure via interfaces between the air conditioners and the enclosure.

Some embodiments of the disclosure provide advantages over previous configurations, and others, by providing an air conditioning system for an enclosure that can cool the interior volume of the enclosure, while providing sufficient sealing to appropriately prevent passage of contaminants into or out of an enclosure via the air conditioning system (e.g., at an interface between components of the air conditioning system and the enclosure). In some embodiments, sufficient sealing may be provided to allow an equipped enclosure to possess an IP69 rating as detailed in publication IEC 60529 of the International Electrotechnical Commission or other similar (or more stringent) seal ratings. "IP" stands for Ingress Protection. The first numerical digit represents the level of solid particle protection. For example, a rating with a "6" as the first numerical digit indicates a dust-tight level of ingress protection from solid particles. This means that there is no ingress of dust and there is complete protection against contact. To achieve a "6" rating for solid particle ingress protection, the object being rated must remain dust free as a vacuum is applied for up to eight hours based on the airflow. The second numerical digit represents the level of liquid ingress protection. For example a rating with a "9" as the second numerical digit indicates the equipment can withstand a high pressure and high temperature water jet. This includes the ability to withstand liquid ingress from close-range high-pressure, high-temperature "spray downs" or washes to achieve the "9" rating for liquid ingress protection, the rated object must be able to withstand a jet of water having a volume of 14 to 16 liters per minute, at a pressure of 8 to 10 MPa, at a distance of 0.10 to 0.15 m, and at a temperature of 80 degrees C. for between two to three minutes with the water jet being applied at various angles relative to the object. For example, a spray down of a cabinet when the cabinet is warm and washed down with cold water. In one example, using the the internal pressure would drop about 8" of water when the inside temperature of the air dropped from 100° F.+ down to 60° F. and the volume remaining constant or so assuming a totally sealed cabinet.

Figure 2:
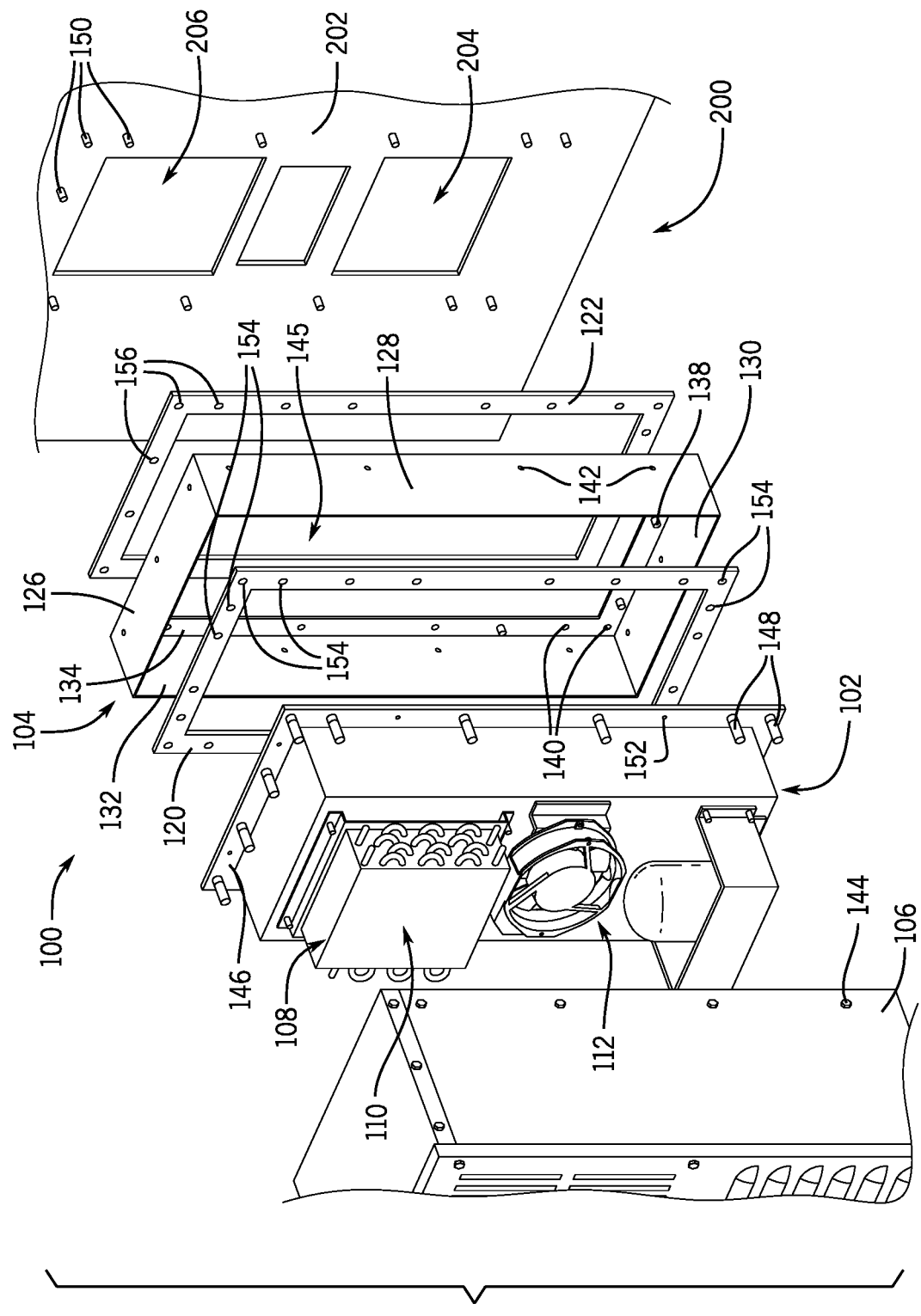
FIG. 2 shows an isometric exploded partial view of the air conditioner of FIG. 1 and an enclosure on which the air conditioner can be installed.
Figure 4:
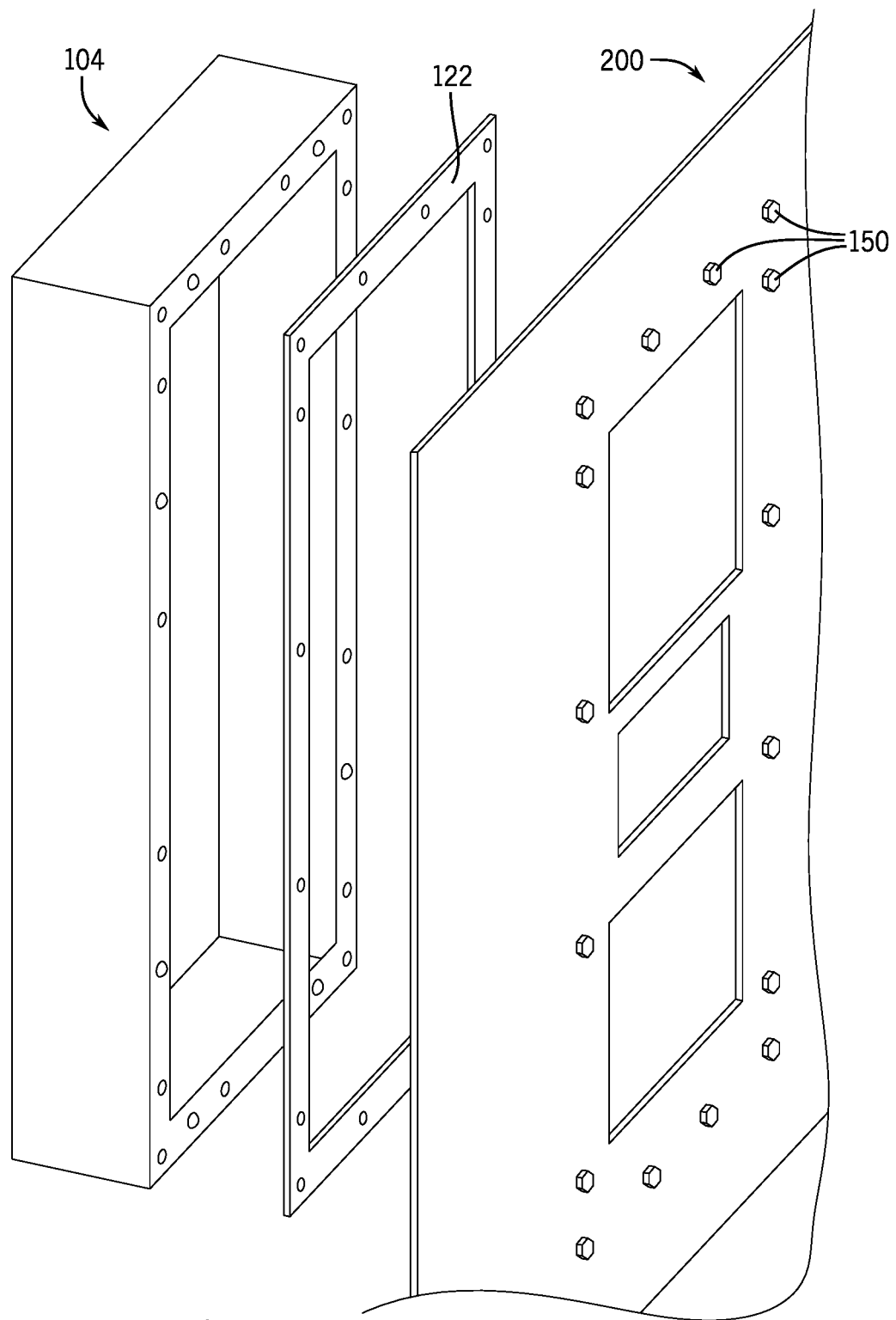
FIG. 4 shows an isometric exploded partial view of a collar and a gasket of the air conditioner of FIG. 1 and the enclosure of FIG. 2.

FIG. 1 shows a front isometric view of an air conditioner 100 for an enclosure according to an embodiment of the invention. The air conditioner 100 includes a tub 102, a collar 104, and a housing 106 (see, e.g., FIG. 2). As also shown in FIGS. 2 and 4, the tub 102 and the housing 106 collectively define an ambient air exchange cavity, and the tub 102 supports a heat exchanger 108 (e.g., a condenser heat exchanger) positioned within the ambient air exchange cavity 110, fans 112, 114, and a compressor 116. The fan 112 is configured to direct air across the heat exchanger 108 to facilitate heat exchange between air located in the ambient air exchange cavity 110 and ambient air that surrounds the enclosure. As shown, the fan 112 is coupled to and is located on the same side of the tub 102 as the heat exchanger 108, although other configurations are possible provided appropriate air flow across the heat exchanger 108 is obtained. As shown in FIGS. 2 and 4 in particular, the housing 106, when coupled to the collar 104, partially encloses the ambient air exchange cavity 110 to partially separate air located within the ambient air exchange cavity 110 from ambient air surrounding the housing 106.

The fan 114 is located outside of the ambient air exchange cavity 110 and is configured to direct (cooled) air into an inlet of the enclosure. More specifically, the fan 114 is located on and is coupled to an opposing side of the tub 102 (e.g., opposite the side the fan 112 is positioned on). As shown in the subsequent figures, the tub 102 defines a cooling cavity 118 that is situated on the opposing side of the tub 102, and that receives the fan 114 and a second heat exchanger 180 (e.g., an evaporator; see FIG. 5) that is part of a closed coolant flow loop with the heat exchanger 108. Thus, as described below, air from the enclosure is received in the cooling cavity 118, is cooled, and is directed back into the (inlet of the) enclosure by the fan 114, generally without passing through the ambient air exchange cavity 110.

Figure 3:
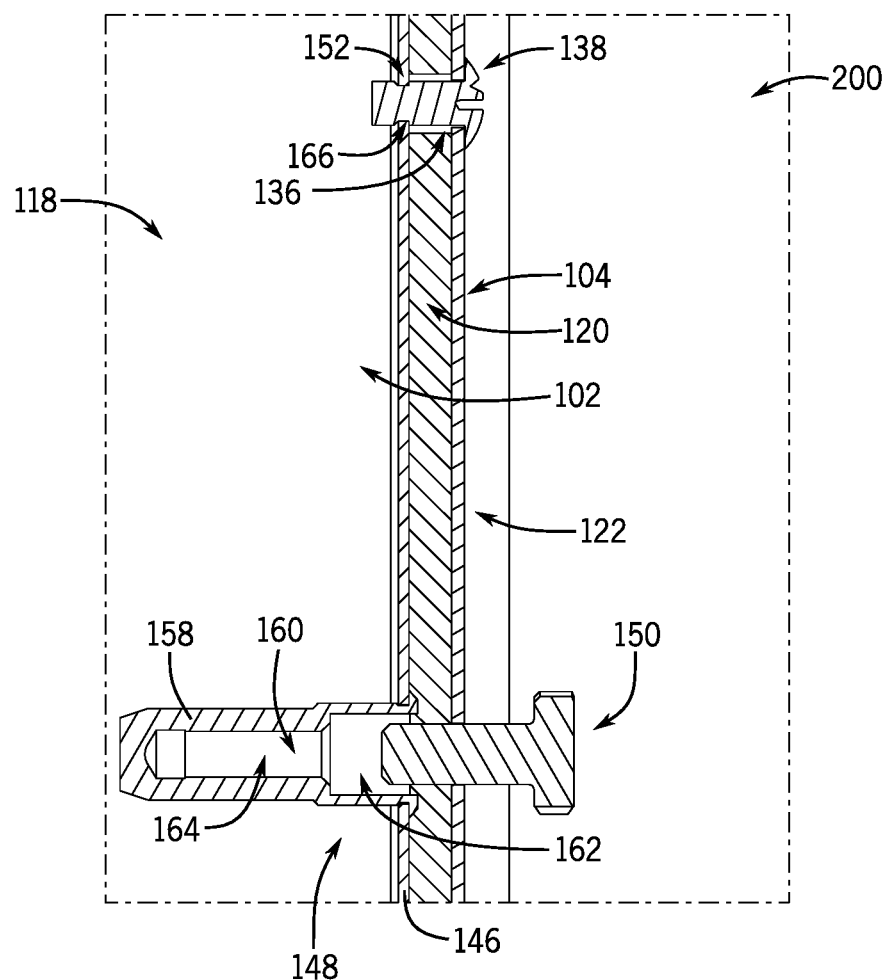
FIG. 3 shows a cross-sectional partial view of the air conditioner of FIG. 1 installed with the enclosure of FIG. 2.

Generally, gaskets or other sealing elements are also provided, to provide a seal between components of the air conditioner and between the air conditioner and an enclosure. In some embodiments, a first gasket 120 can provide a seal to prevent passage of air between the ambient air exchange cavity 110 and the cooling cavity 118, and a second gasket 122 can provide a seal to prevent passage of air from outside of the air conditioner into the cooling cavity 118 or the enclosure generally. In this regard, for example, air conditioner 100 includes gaskets 120, 122. As shown in FIG. 3 in particular, for example, the gasket 120 is positioned between the tub 102 and the collar 104. As also shown in FIG. 3, for example, the gasket 122 is configured to be positioned between a surface of the enclosure and the exterior surface of the collar 104. Thus, the gaskets 120, 122 are positioned on opposing sides of the collar 104.

The air conditioner 100 also includes a condensed water coil 124. In some embodiments, the condensed water coil 124 is positioned within the cooling cavity 118 to facilitate collection of water that condenses from air that is cooled within the cooling cavity 118. Thus, in some configurations the condensed water coil 124 can include components or features that allow water to be more effectively routed and collected within the condensed water coil 124, for example, a pan, funnel, etc. (not shown).

FIG. 2 shows an isometric exploded view of the air conditioner 100 in position for installation with an enclosure 200. As shown, the collar 104 includes sides 126, 128, 130, 132 that structurally define an outer perimeter of the collar 104. In the illustrated embodiment, the sides 126, 130 are substantially parallel to each other (e.g., deviating by less than 20°), the sides 128, 132 are substantially parallel to each other, the sides 126, 128 are substantially perpendicular to each other, and the sides 130, 132 are substantially perpendicular to each other. The collar 104 includes a peripheral flange 134 that extends around the entire perimeter of the collar 104 (defined by corresponding edges of each of the sides 126, 128, 130, 132), and which is directed from the sides 126, 128, 130, 132 towards a central region of the collar 104. The peripheral flange 134 is configured as a continuous flange and includes a plurality of holes 136 (see FIG. 3) each of which receives a corresponding fastener 138, and a plurality of holes 140 each of which receives a different fastener, as further described below.

In some embodiments, a collar can also include a plurality of holes that serve as mounting locations for coupling a housing (e.g., the housing 106 shown in FIG. 2) to the collar. For example, the collar 104 includes holes 142 that are located on each of the sides 126, 128, 128, 130, and each hole of the holes 142 is configured to receive a fastener 144 (e.g., a screw, bolt, etc.) to couple the housing 106 to the collar 104 (e.g., the fastener 144 threadingly engages a corresponding hole 140).

Generally, the sides 126, 128, 130, 132 (and the peripheral flange 134) can define a collar cavity 145 that is configured to receive the tub 102, as described below. Further, the collar 104 can be formed to be generally seamless (e.g., along the sides 126, 128, 130, 132) so that air can generally pass into the collar cavity 145 only through the open space within the perimeter of the peripheral flange 134 the open space between the sides 126, 128, 130, 132 opposite the peripheral flange 134.

In some embodiments, a tub can include a peripheral flange that is configured to engage with a peripheral flange of a collar. For example, as illustrated, the tub 102 includes a peripheral flange 146 that extends around the entire perimeter of the tub 102 (e.g., defined by a peripheral edge of the tub 102), and that is directed away from a central region of the tub 102 (e.g., the peripheral flange 146 of the tub 102 extends radially away from a central location).

In some cases, it may be helpful to provide fastener assemblies that do not require threaded engagement between a fastener and fastener holes in a collar, tub or other component of an air conditioner assembly. For example, the peripheral flange 146 includes a plurality of fastener receivers 148 that are coupled to an interior surface of the peripheral flange 146 and extend outward past the exterior surface of the peripheral flange 146. Each fastener receiver 148 is configured to receive a corresponding fastener 150 that is inserted through a wall 202 of the enclosure 200, and through a corresponding hole 140 of the collar 104 to couple the enclosure 200 to the collar 104 and the tub 102. In some embodiments, the fastener receiver 148 is sealed on one end (e.g., a rivet nut or a blind nut).

The peripheral flange 146 of the tub 102 also includes a plurality of holes 152 that are configured to receive a corresponding fastener 138. Although the peripheral flange 146 extends away from the central region of the tub 102, in alternative configurations, a peripheral flange of a tub can extend towards the central region of the tub. However, this configuration could be more difficult to manufacture, and locating corresponding fastener receivers in a cooling cavity, when assembled, may be undesirable (e.g., may be more prone to rust formation from water condensation).

In different embodiments, different types of gaskets can be used to provide appropriate sealing between air conditioner components and between air conditioner components and an enclosure. For example, each gasket 120, 122 is illustrated as having a bore directed therethrough, and a substantially uniform width (e.g., one inch) that spans around the entire perimeter of the corresponding gasket 120, 122. As shown, the gaskets 120, 122 are rectangular in shape, and have similar dimensions to each other (e.g., similar widths). However, in alternative embodiments, the shapes, dimensions, and relative shapes and dimensions of gaskets for similar purposes can be different as appropriate. Each of the gaskets 120, 122 is also formed without using an extrudable sealing compound (e.g., extruded silicone as applied in a sealing bead). This may be useful, for example, in order to avoid the difficulty of obtaining an appropriate seal with an extruded sealing compound, as well as to allow more reliable and standardized sealing configurations, simpler overall installation processes, and flexibility in allocation of assembly steps between manufacturing and installation locations.

Continuing, in the illustrated embodiment, the gasket 120 includes a plurality of holes 154, while the gasket 122 includes a plurality of holes 156. Some holes of the plurality of holes 154 correspond to the fasteners 138, while other holes of the plurality of holes 154 correspond to the fasteners 150. For the gasket 122, the plurality of holes 156 are illustrated as only corresponding to the fasteners 150. Thus, as also discussed below, some fasteners can extend through both of the gaskets 120, 122, whereas other fasteners can extend only through the gasket 120. In some cases, the plurality of holes 154 have a substantially similar size (e.g., deviating by less than 20 percent), and the plurality of holes 156 can also have a substantially similar size (e.g., the holes 154, 156 being similarly sized). In alternative embodiments, for example those using other sizes of fasteners, it can be appreciated that the sizing of the holes 154, 156 can be adjusted appropriately to correspond to the size of the particular fasteners.

In some embodiments, to assemble the air conditioner 100, the gasket 120 is inserted into the collar cavity 145, is positioned against an interior surface of the peripheral flange 134 of the collar 104, and aligned with the holes 136 of the peripheral flange 134. Then, each of the fasteners 138 are inserted through a respective hole 136 of the collar 104, through a respective hole 154 of the gasket 120, and received within a respective hole 152 of the peripheral flange 146 of the tub 102 to secure the collar 104 to the tub 102, with the gasket 120 positioned (and in some cases compressed) between the flanges 134, 146. In some cases, the fasteners 138 can be snap-fitted into a respective hole 152. Once the tub 102 is secured to the collar 104, the cooling cavity 118 can be appropriately sealed against contaminants traveling from the ambient environment within the housing 106 and into the cooling cavity 118.

In some embodiments, the air conditioner 100 can then be secured to the wall 202 of the enclosure 200. In some cases, the gasket 122 can be aligned with the fasteners 150 or the holes directed into the wall 202 of the enclosure 200, and can be positioned against an exterior surface of the peripheral flange 134 of the collar 104. Then, each fastener 150 can be inserted through a respective hole 156 of the gasket 122, through a respective hole 140 of the peripheral flange 134 of the collar 104, through a respective hole 154 of the gasket 120, and into (and engaged with) a respective fastener receiver 148 to couple the tub 102 to the wall 202 of the enclosure 200 with the gasket 122 positioned (and in some cases compressed) between an exterior surface of the peripheral flange 134 and the wall 202 of the enclosure 200. With the gasket 122 appropriately positioned and secured (e.g., in some cases compressed), the gasket 122 can appropriately seal the interface between the air conditioner 100 and the enclosure 200 to prevent contaminants located within the ambient environment surrounding the air conditioner 100 and the housing 106 from traveling into the cooling cavity 118 and the enclosure 200 in general. In some cases, when the gaskets 120, 122 are assembled and compressed against respective surfaces (e.g., the gasket 120 being compressed against the tub 102 and the collar 104, and the gasket 122 being compressed against the collar 104 and the wall 202 of the enclosure 200), this compression can prevent contaminants (e.g., dust) from traveling into the enclosure 200 via the interfaces (or tolerances) between the components (e.g., between the peripheral flanges 134, 146).

In some embodiments, the housing 106 can be coupled to the collar 104, via the engagement between the fasteners 144 and the holes 142 of the collar 104. The fasteners 144 extend from the ambient environment through the housing 106 and into the collar cavity 145 (shown in FIG. 2). The fasteners 144 do not extend into the cooling cavity 118 (shown in FIG. 5) because the peripheral flange 146 around the tub 102 defines a space between the sides 126, 128, 130, 132 of the collar 104 and the housing 106 in which the fasteners 144 can extend. This arrangement, for example, may allow for relatively easy removal of the housing 106 without affecting any seals provided by the gaskets 120, 122. In other embodiments, however, a housing can be otherwise secured.

In some embodiments, once the air conditioner 100 is appropriately installed, air located within the enclosure can be cooled while appropriately sealing between the air conditioner 100 and the enclosure 200. In some embodiments, the installation can provide an IP69 rating for ingress protection between the outside of the air conditioner 100 and the cooling cavity 118. In particular, once the fan 114 is activated, air is driven into an inlet 204 of the enclosure 200, which is in fluid communication with the interior volume of the enclosure 200. As air is driven into the inlet 204, air located within interior volume of the enclosure is driven out through the outlet 206 (in fluid communication with the interior volume of the enclosure) and into the cooling cavity 118. The second heat exchanger 180 can then absorb heat from the incoming air from the enclosure 200, to cool the air within the cooling cavity 118, and the absorbed heat can be passed via closed-loop coolant flow across boundary of the cooling cavity 118 to the heat exchanger 108 (with appropriate sealing for the coolant flow passages between the cavities 110, 118 to mitigate contaminants traveling between the cavities 110, 118). As the fan 112 activates, air is blown across the refrigerant tubes of the heat exchanger 108 that extend into the ambient air exchange cavity 110 and heat is removed from the refrigerant located within the refrigerant tubes to be rejected to the ambient environment. Thus, the fan 114, which directs air from the cooling cavity 118, can provide cooled air to the interior volume of the enclosure 200.

In some embodiments, as also noted above, some fasteners may extend across only a subset of gaskets for an air conditioner, to help ensure appropriate sealing. In this regard, for example, FIG. 3 shows a cross-sectional view of the air conditioner 100 installed with the enclosure 200. As shown, the fastener 150 extends through the gasket 122, through the collar 104, and is received and secured with the corresponding fastener receiver 148. The fastener 138, however, is illustrated as extending only through the collar 104 and the gasket 120, and being received and secured with the corresponding hole 152. Thus, a head of each of the fasteners 138 can be positioned between the gaskets 120, 122 and the fasteners 138 can avoid extending across the gasket 122. In some embodiments, an exterior surface of the gasket 122 can contact a surface of the head of each of the fastener 138. Although the fastener 138 is illustrated as having a convex head, in alternative configurations, the head of each fastener 138 can be substantially flat, which may better correspond to the relevant surface of a gasket in some cases (e.g., which may provide better sealing or spatial compression of the gasket).

As generally noted above, different types of fasteners can be used, including different types of blind fasteners, which may avoid threaded engagement between a fastener and a tub or collar of an air conditioner. For example, each fastener receiver 148 has an elongated body 158 that extends beyond the exterior surface of the peripheral flange 146 away from the enclosure 200. The elongated body 158 has a bore 160 that is directed through a first end of the elongated body, and which extends partially along the axial length of the elongated body 158. The bore 160 has a first portion 162 having a first diameter, and a second portion 164 having a second diameter. In the illustrated embodiment, the first diameter of the first portion 162 is larger than the diameter of the second portion 164.

As shown, the fastener 150 threadingly engages the walls of the elongated body 158 within the first portion 162 of the bore 160. Importantly, because the bore 160 does not extend through the second end of the elongated element, possible contaminants are prevented from traveling through the bore 160 and into the ambient air (or vice versa). Thus, the fasteners 150 do not threadingly engage holes that are directed entirely through the tub 102 (e.g., directed through the peripheral flange 146), which may be advantageous because such threaded holes could undesirably allow contaminants to travel into (or out of) the ambient air even when a fastener (e.g., the fastener 150) engages with such a hole due to the tolerance between the threads of the fastener and the hole, and the pressure differential generated during a spray down procedure. In other words, the engagement between a fastener 150 and a corresponding fastener receiver 148 (that is sealed on one end) prevents dust and/or liquid from traveling through the threading.

In some embodiments, and as illustrated, the fastener 138 includes a neck region 166 that has a smaller diameter than the remaining stem of the fastener 138. The neck region 166 corresponds to the diameter of the hole 136. In some cases, the fastener 138 can be installed by rotating (or tightening) the fastener 138 until the neck region 166 of the fastener 138 seats against the edges that define the corresponding hole 136. Similarly to the fastener 150, in some configurations, each hole 152 does not include threads, and rather each fastener 138 is snap-fitted, in a rivet-like manner, to couple the gasket 120 and the collar 104 to the peripheral flange 146 of the tub 102. This can, as described above, mitigate contaminants from escaping from the cooling cavity 118 and exiting into the ambient environment (and vice versa).

In some embodiments, although not shown in FIG. 3, fastener receivers (similar to the fastener receivers 148, but sized and configured appropriately) can be coupled to the peripheral flange 146 in a similar manner as the fastener receivers 148. Then, a fastener 138 can be threadingly engaged with the corresponding fastener receiver to couple together the tub 102, the collar 104, and the gasket 120. In particular, a fastener 138 is received through the a hole 136 of the peripheral flange 134 of the collar 104, through a hole 154 of the gasket 120, and fastened (and threadingly engaged) with a corresponding fastener receiver of the tub 102 (that has an opposing end that is sealed). In some cases, the fastener receivers (that correspond to the fasteners 138) can be rivet nuts.

Figure 5:
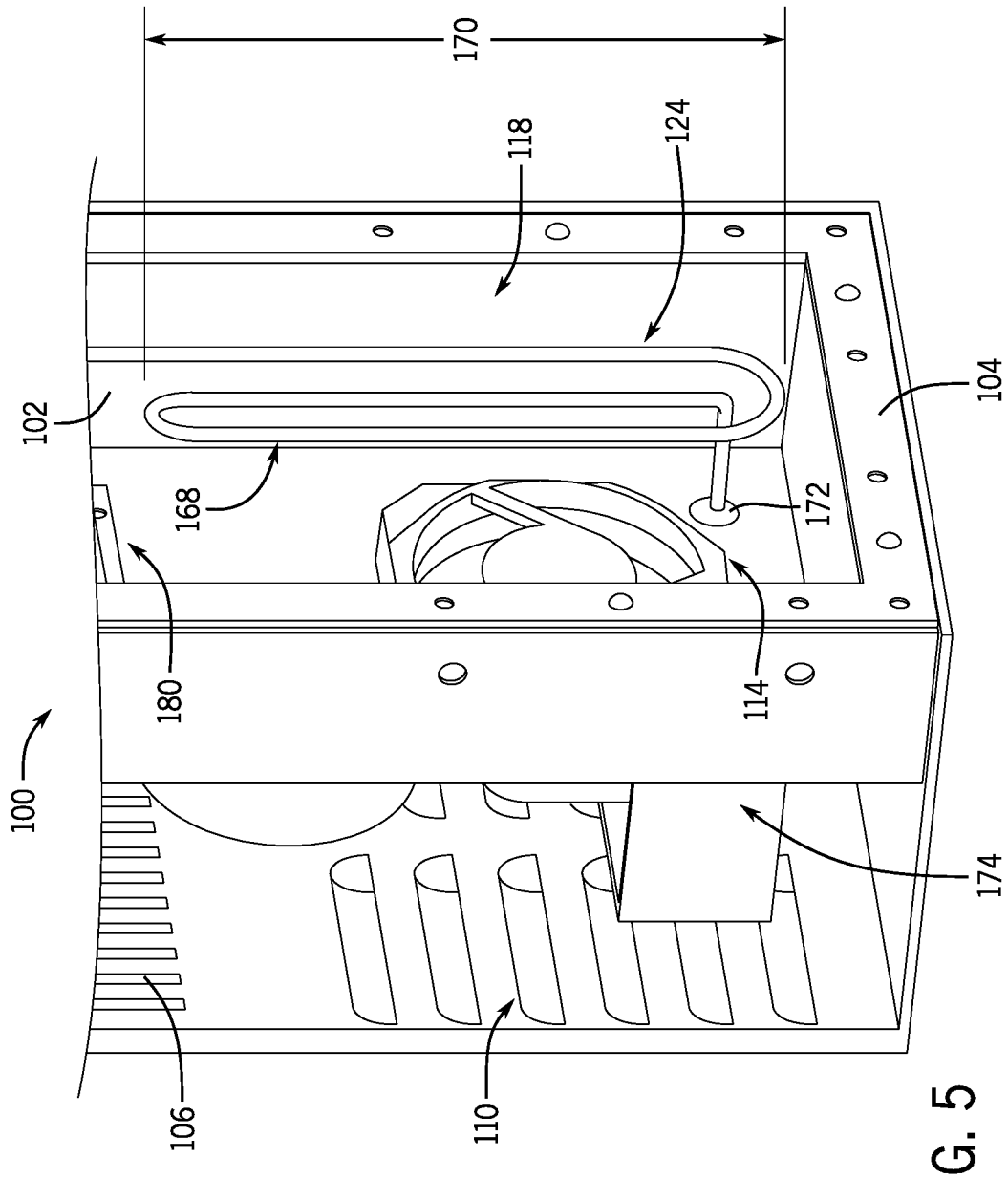
FIG. 5 shows a rear isometric partial view of the air conditioner of FIG. 1, with the gasket of FIG. 4 removed.
Figure 6:
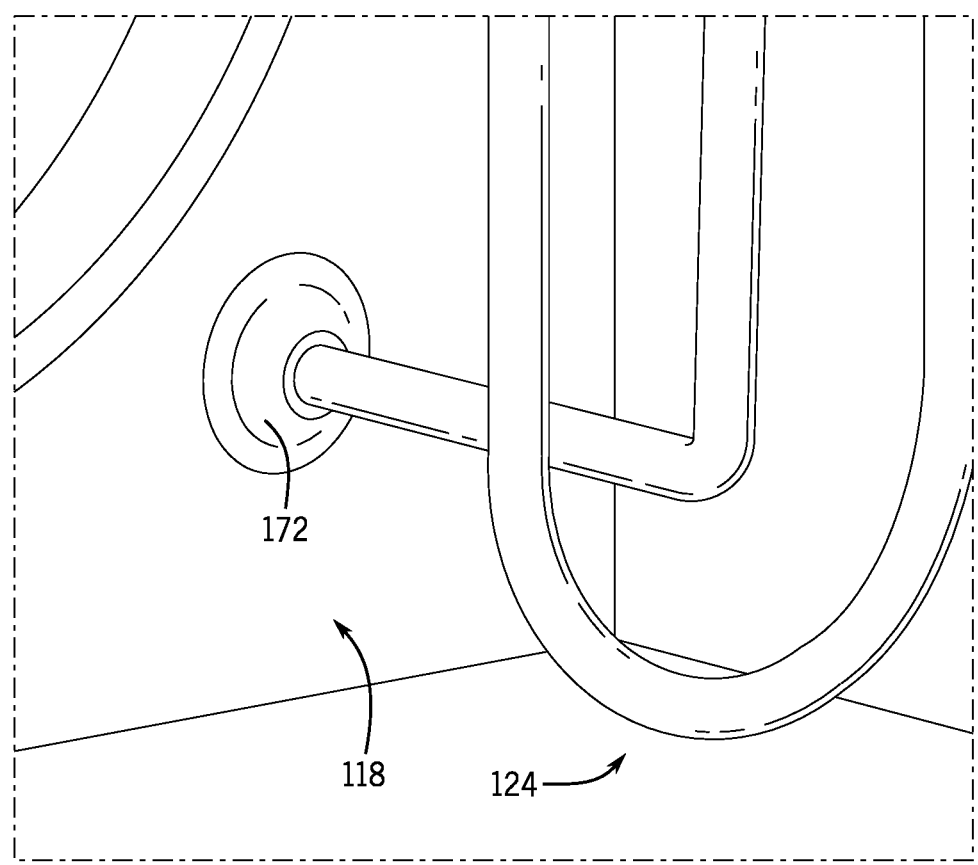
FIG. 6 shows a close up view of FIG. 5, including a condensed water coil of the air conditioner of FIG. 1.
Figure 7:
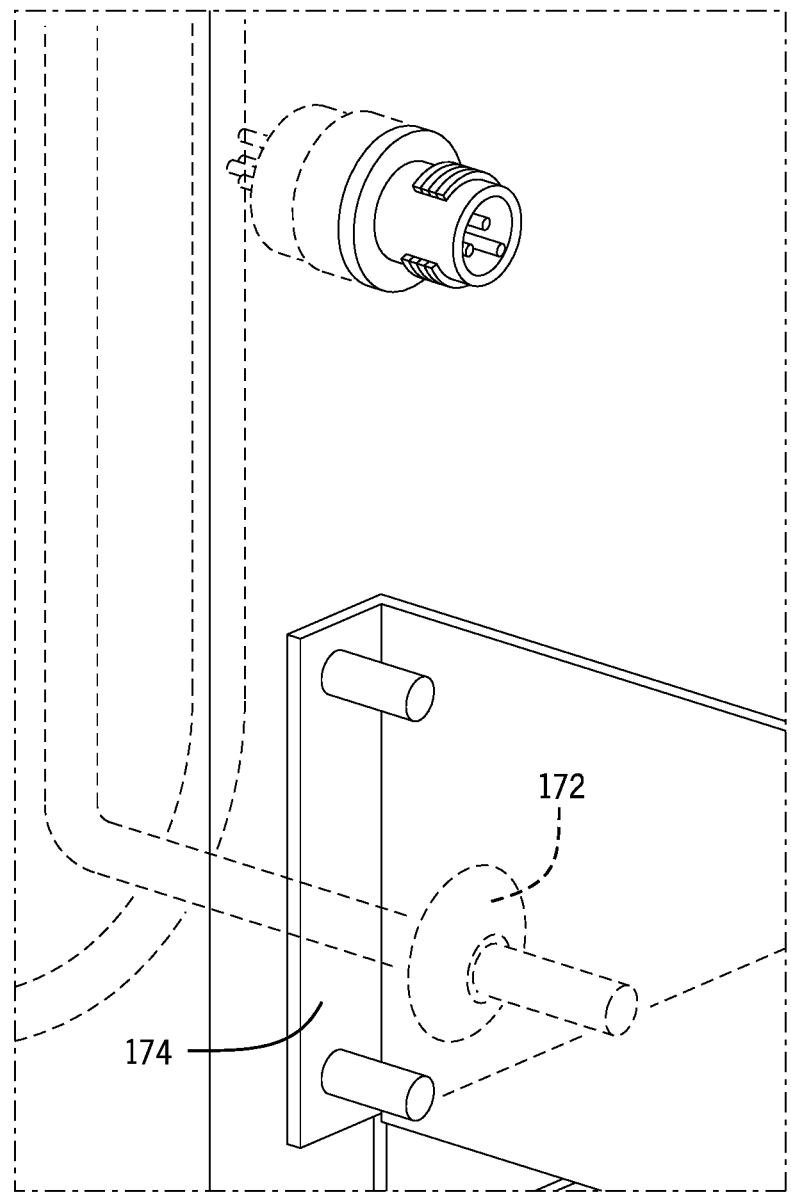
FIG. 7 shows front isometric partial view of the condensed water coil of the air conditioner of FIG. 1.
Figure 8:
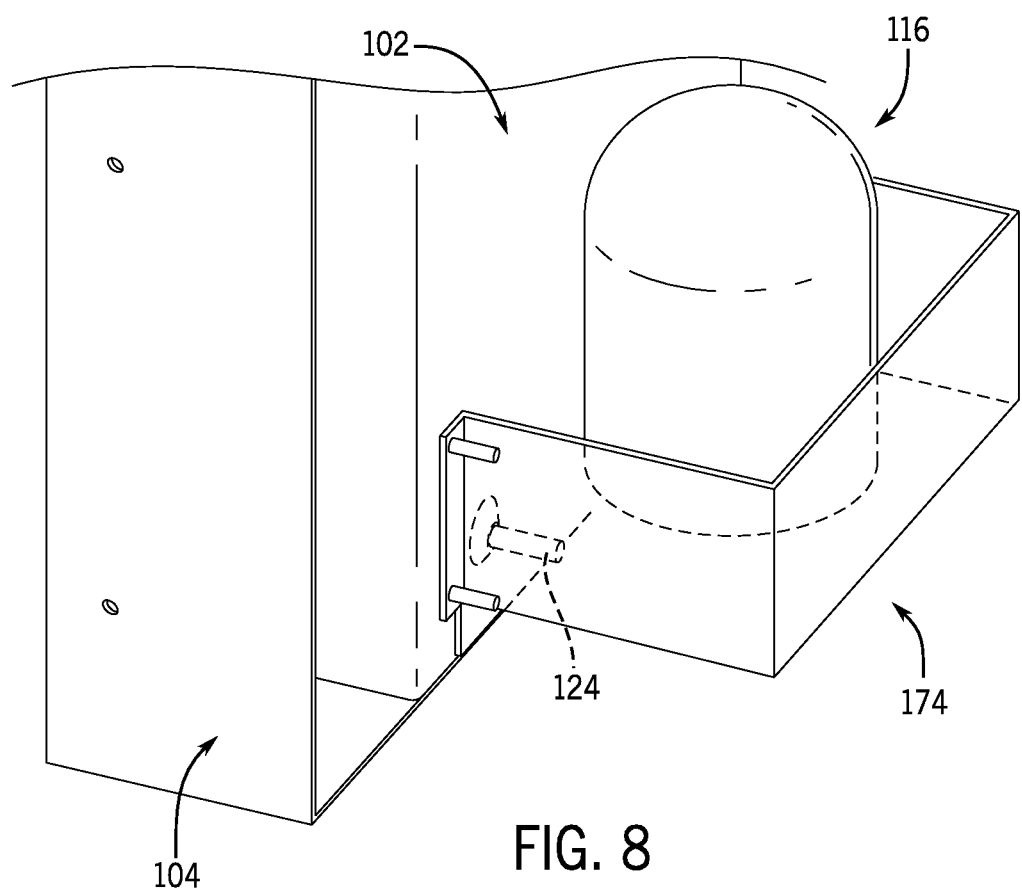
FIG. 8 shows a front isometric partial view of the air conditioner of FIG. 1.
Figure 9:
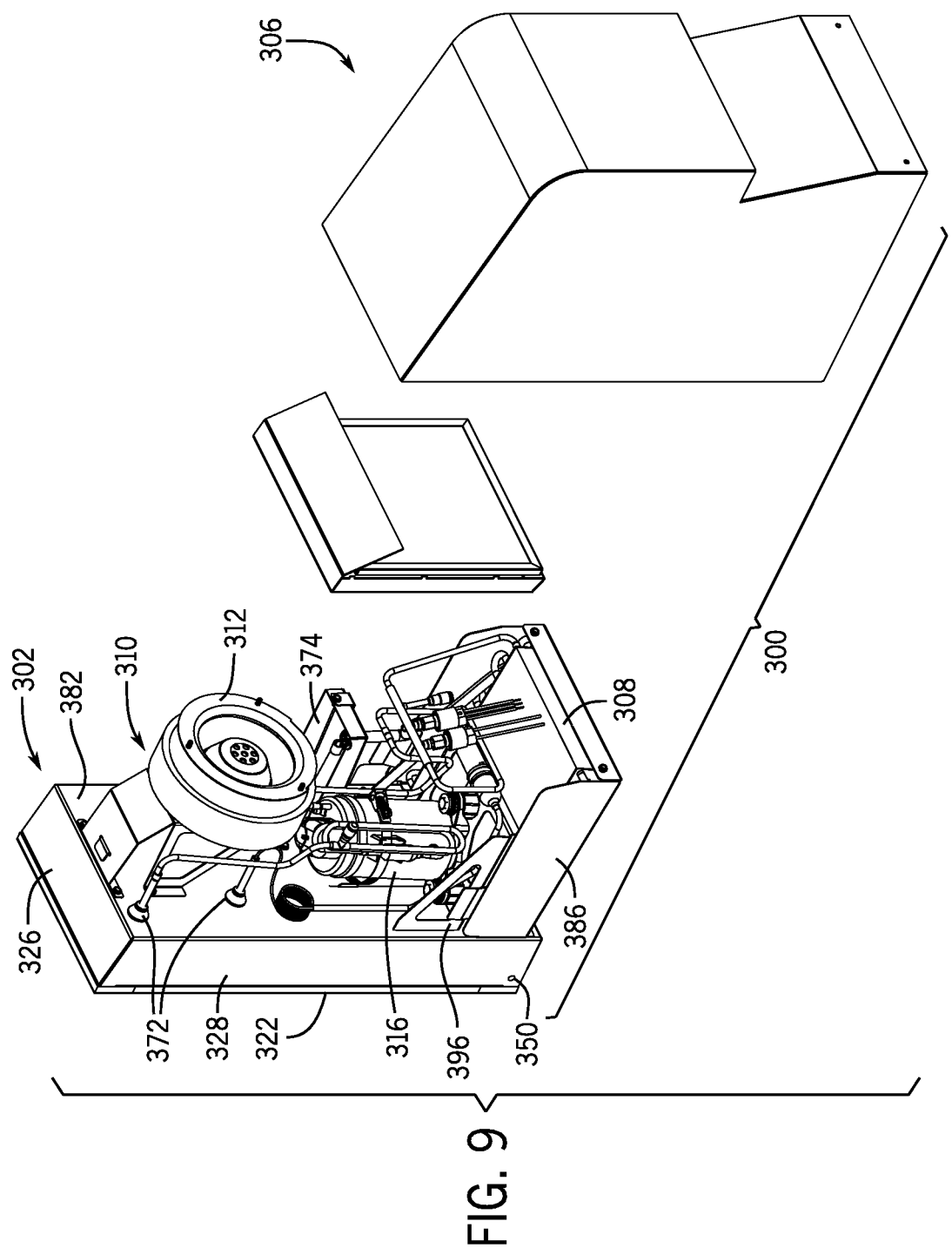
FIG. 9 shows a front isometric exploded view of an air conditioner for an enclosure according to another embodiment of the invention.
Figure 10:
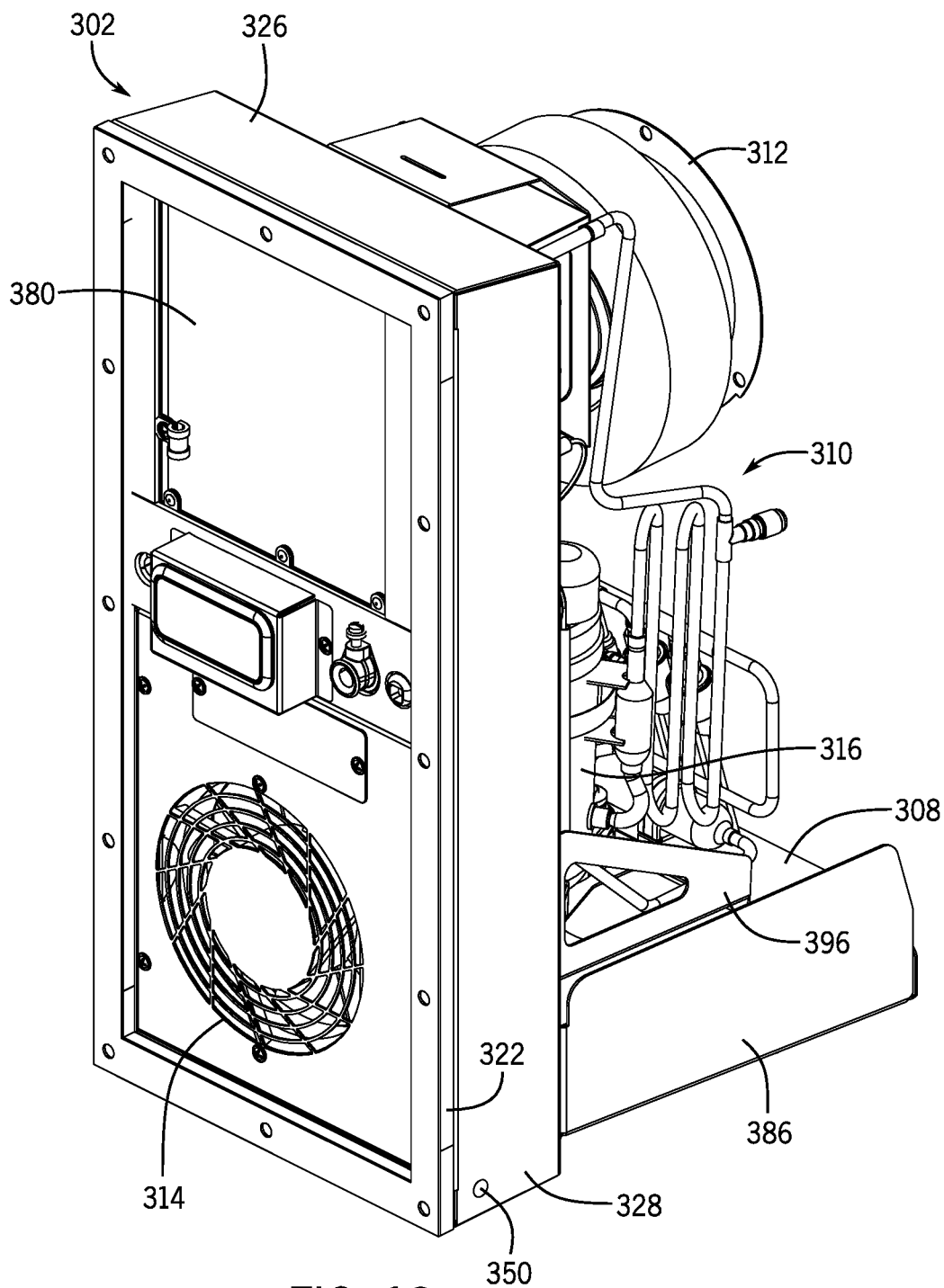
FIG. 10 shows a rear isometric partial view of the air conditioner of FIG. 9.

FIG. 5 shows a rear isometric view of the air conditioner 100, with the gasket 122 removed. As shown, the condensed water coil 124 is situated within the cooling cavity 118 and is configured, at an inlet to the water coil 124, to collect water that condenses from the air located within the cooling cavity 118. In some configurations, the condensed water coil 124 can include a trap 168 of a suitable vertical height, or trap height 170, that is based on the pressure differential that can be created during a spray down procedure (described below). For example, the trap height 170 can be greater than the altered level of the water within the trap 168 created by the pressure differential generated during a spray down procedure, so that water located within the condensed water coil 124 flows within but does not escape out of the inlet of the condensed water coil 124 and correspondingly does not permit air flow between the cooling cavity 118 and the air exchange cavity 110. In some specific examples, during a spray down procedure, the air conditioner 100 can be warm from usage (e.g., about 100° F. or more) and when sprayed with cold water, the temperature of the air conditioner 100 can drop down to about 60° F., which can result in an internal pressure drop within the cooling cavity 118 of about eight inches of water. Therefore, a trap height 170 of the trap 168 of eight inches or greater than eight inches (e.g., nine inches) may be sufficient for preventing the escape of water back through the inlet of the condensed water coil 124 during a spray down procedure.

In some configurations, for example the air conditioner 100 as shown, elements of the air conditioner 100 can be arranged to accommodate the trap height 170 of the trap 168. For example, the second heat exchanger 180 can be positioned within the upper portion of the cooling cavity 118. Locating the second heat exchanger 180 within the upper portion of the cooling cavity 118 provides a space within the cooling cavity 118 below the second heat exchanger 180 for a trap 168 of sufficient trap height 170 to be placed without requiring increasing the overall size of the air conditioner 100. The upper positioning of the second heat exchanger 180 also aids in filling the trap 168 via gravity when condensation drips from the second heat exchanger 180 and into the trap 168.

As shown in FIGS. 5-8, the condensed water coil 124 is directed through the tub 102 and into the ambient environment (e.g., that surrounds the housing 106). In some embodiments, the housing 106 itself can provide some liquid ingress protection between the tub 102 and the cooling cavity 118 by physically preventing a way for a liquid to be directly sprayed onto the tub 102. In those embodiments, some connectors (e.g., pipe grommets and electrical connectors) on the tub 102 can have a liquid ingress rating lower than the overall air conditioner rating. For example, a grommet 172 positioned around the condensed water coil 124 and coupled to both an interior surface of the tub 102 and an exterior surface of the tub 102 to generate a seal to mitigate or prevent contaminants from flowing from the cooling cavity 118 and into the ambient environment (and vice versa) can have a rating of IP66 or potentially lower. In the IP66 rating, the second numerical digit, "6," represents liquid ingress protection against powerful water jets. To achieve a liquid ingress protection rating of "6," the object being rated must withstand a jet of water having a volume of 100 liters per minute, at a pressure of 100 kPa, and at a distance of 3 m for up to about three minutes.

In some configurations, a tray 174 can be coupled to the exterior surface of the tub 102. The tray 174 can be configured to collect water emitted from an outlet of the condensed water coil 124. In some embodiments, a similar arrangement (e.g., appropriately rated grommets 172, including IP66 rated grommets) can also be used to seal the passage, across a wall of the tub 102, of tubing between the heat exchangers 108, 180 and the condensed water coil 124. As stated above, with the housing 106 installed and the air conditioner 100 fully assembled, the seal provided by IP66 rated grommets is even more protected from direct water streams, effectively increasing the seal of IP66 rated grommets to that of an IP69 rated seal.

In some configurations, insulation can be provided at various locations throughout the air conditioner 100 to mitigate undesirable heat transfer. For example, insulation can be provided on an exterior surface of the peripheral flange 146 of the tub 102 (e.g., opposite the side of the flange 146 that contacts the gasket 120) to fill the space between the tub 102 and the side walls 126, 128, 130, 132. As another example, insulation can be provided to line the entire (or a partial) surface of the cooling cavity 118.

Although the description above has described the tub 102 and the collar 104 as being separate components, the tub 102 and the collar 104 can be a single contiguous (or monolithic) piece, for example, a single integrally formed piece. For example, the flanges 146, 134 can be welded together to create a seamless and thus fully sealed connection between the components and to couple the components together. Or other similar configurations are possible, including as further described below.

FIGS. 9 through 12 illustrate another embodiment of an air conditioner 300 according to the invention. In many aspects, the air conditioner 300 is similar to the air conditioner 100 described above and similar numbering in the 300 series is used for the air conditioner 300. For example, the air conditioner 300 has a tub 302; a housing 306; a first heat exchanger 308 (e.g., a condenser) in an ambient air exchange cavity 310; a second heat exchanger 380 (evaporator) in a cooling cavity 318; a pair of fans 312, 314; a compressor 316; a tray 374; and grommets 372 for passing coolant and condensed water coil lines through the tub 302.

In some aspects, however, the air conditioners 100, 300 differ from each other. For example, the tub 302 is generally a combination of aspects of the tub 102 and the collar 104, with the tub 302 partly defining and preventing air flow between different cavities of the air conditioner 300, as further discussed below. The tub 302 has sides 326, 328, 330, 332 and a peripheral flange 334 that extends around the entire perimeter of the tub 302 (defined by corresponding portions of each of the sides 326, 328, 330, 332 directed inward toward each other). The adjoining edges of the sides 326, 328, 330, 332, including the edges of the portions of the sides 326, 328, 330, 332 forming the flange 334, are welded together. Welding creates a dust and liquid tight seal and prevents water or dust from entering the tub 302 via the edges of the tub 102 when the air conditioner 300 is installed on an enclosure (not shown). The welds around the flange 334 can be ground flat to provide an exterior surface 376 that is flat and continuous (i.e., having no interruptions) to provide a more consistent and uniform mating with the enclosure and contact with a gasket 322 positioned therebetween.

The flange 334 also includes a plurality of fastener receivers 348 (e.g., blind nuts) that are coupled to an interior surface of the peripheral flange 334 and extend into the tub 302. Each fastener receiver 348 is configured to receive a corresponding fastener 350 that is inserted through a wall of the enclosure (see for example the wall 202 of the enclosure 200 shown in FIG. 2) and is configured to be fully enclosed (i.e., there is no access through the fastener receiver 348 into the tub 302). The sides 328, 332 also include a plurality of fastener receivers 348 coupled to the interior surface of the sides 328, 332 and extending into the tub 302. Each fastener receiver 348 in the sides 328, 332 is configured to receive a corresponding fastener 350 that is inserted through the housing 306 to secure the housing 306 to the tub 302.

Figure 11:
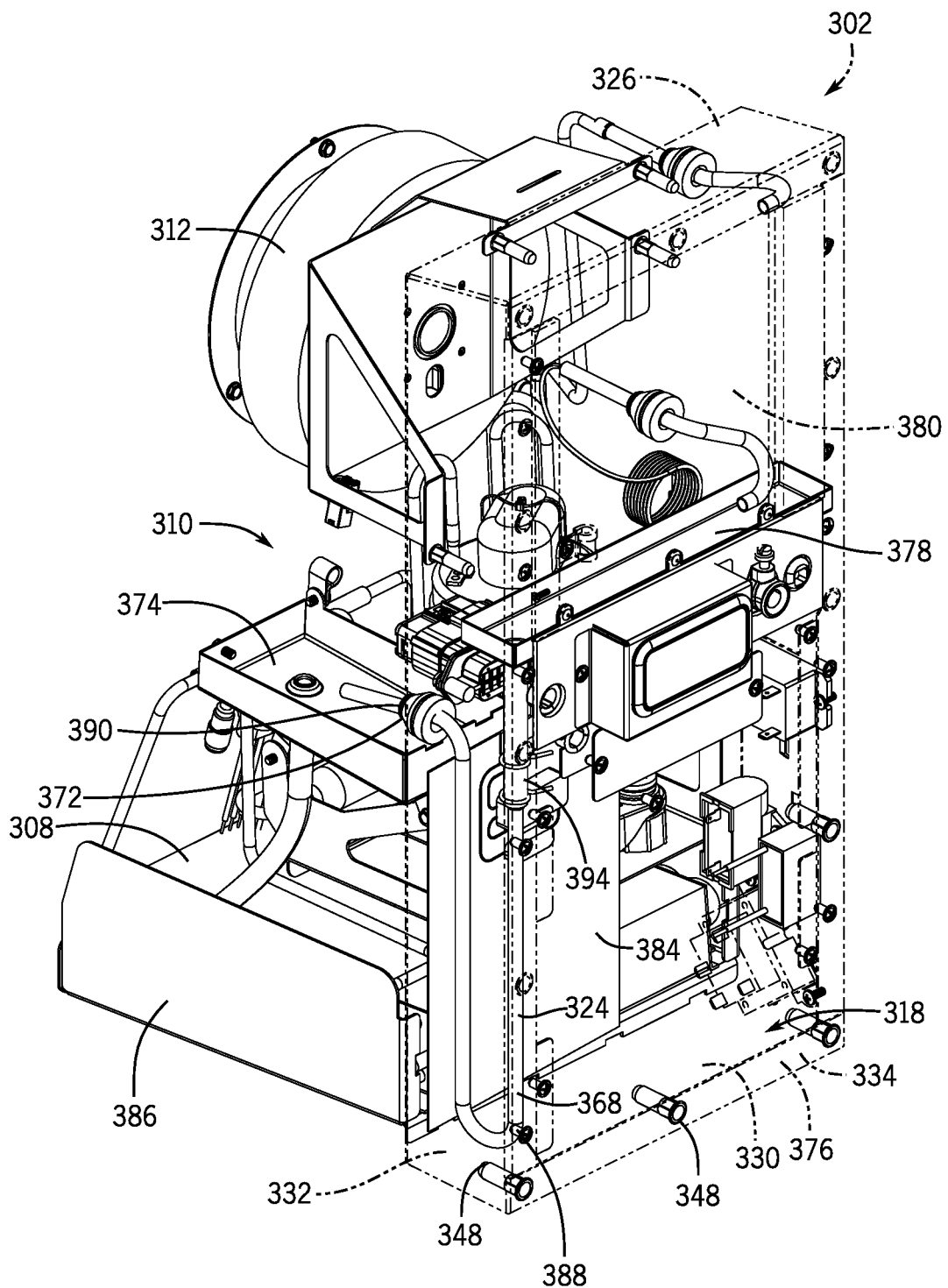
FIG. 11 shows a rear isometric partial view of the air conditioner of FIG. 9, with certain components rendered transparent to show internal structures.
Figure 12:
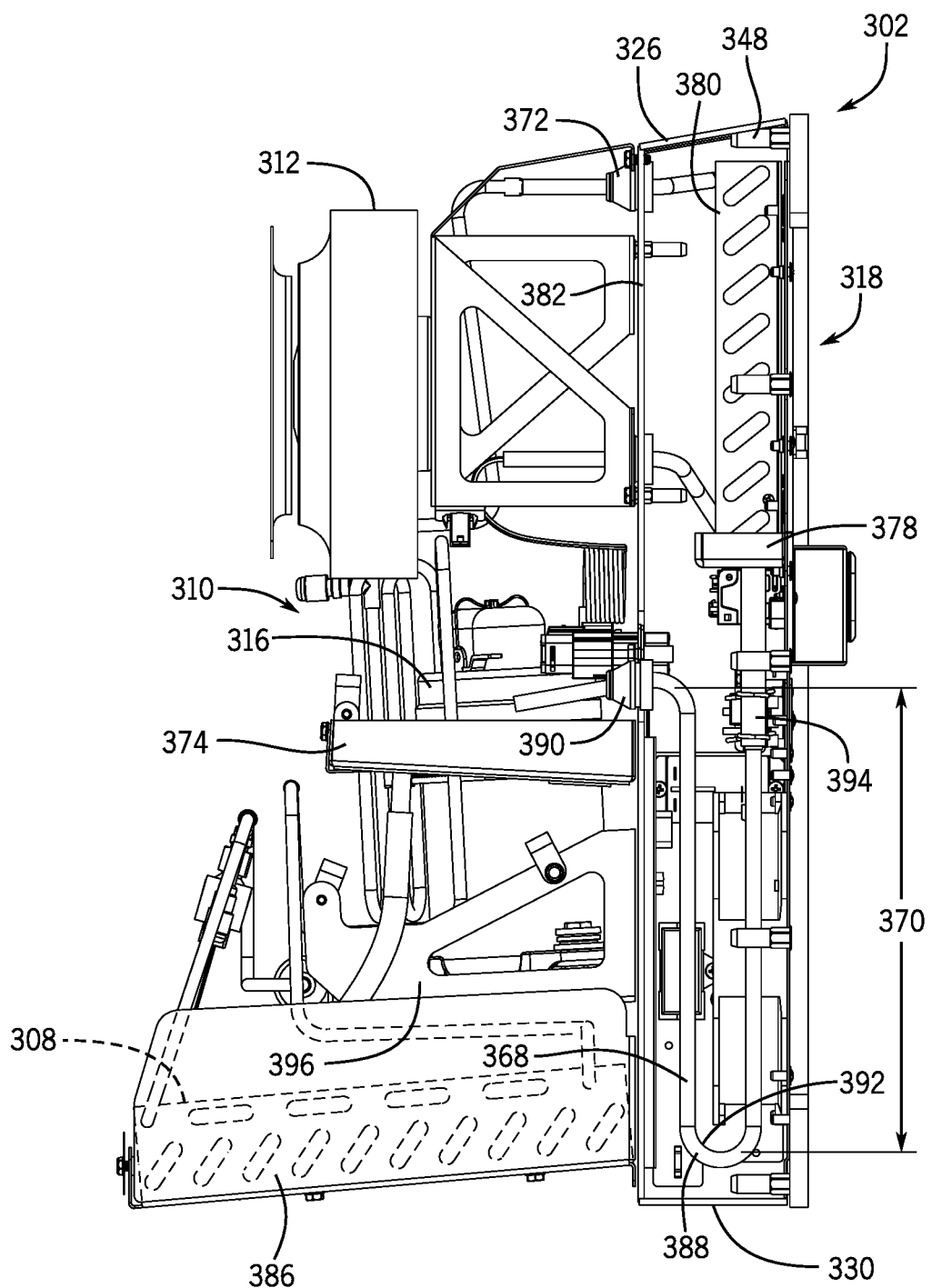
FIG. 12 shows a right side elevation partial view of the air conditioner of FIG. 9, with certain components rendered transparent to show internal structures.

Looking at FIGS. 11 and 12, the evaporator 380 is shown placed within the top half of the tub 302. An evaporator tray 378 is placed below the evaporator 380 to catch condensate dripping from the evaporator 380. A condensed water coil 324 extends downward from an inlet at the evaporator tray 378 to a bend 388 and extends back up (thereby defining a trap 368 with a trap height 370) and has an outlet 390 that exits through the wall 382 of the tub 302 from the cooling cavity 318 to the ambient air exchange cavity 310. The outlet 390 exits the cooling cavity 318 at a location lower than the evaporator tray 378. The trap height 370 is defined as the distance from a top 392 of the bend 388 of the condensed water coil 324 to the bottom of the outlet 390. The condensed water coil 324 is configured to direct captured condensate from the evaporator 380 out to the tray 374 where it can evaporate to the surrounding environment. In some embodiments, a heater 384 (see FIG. 11) can be provided (e.g., attached to the tray 374) to increase the rate of evaporation.

Generally, a longer trap height increases the amount of water trapped therein and thus increases the amount of external pressure required to clear the trap (i.e., a longer trap length increases the water seal of the trap). In some embodiments, the condensed water coil 324 trap height 370 is based on the pressure differential created by a spray down procedure as discussed above with respect to the air conditioner 100. For example, mounting the evaporator 380 within the top half of the tub 302 provides space for the condensed water coil 324 to have a trap height 370 greater than the altered level of the water within the trap 368 created by a pressure differential generated by the spray down procedure. Therefore, water located within the condensed water coil 324 can flow within but will not escape out of an inlet 394 of the condensed water coil 324. In some specific examples, as discussed above, a spray down procedure can generate a pressure differential of eight inches of water within the cooling cavity 318, and thus the trap height 370 of the trap 368 being eight inches or greater than eight inches (e.g., nine inches) may be sufficient for preventing the escape of water back through the inlet 394 of the condensed water coil 324. The condensed water coil 324 is thus configured to prevent dust from entering the tub 302 during operation and capable of attaining an IP69 rating.

In addition to the grommets 372 being appropriately rated, it should also be noted that any electrical connectors extending through the wall 382 of the tub 302 from inside the tub 302 to the ambient air exchange cavity 310 are also appropriately rated, including having an IP66 rating or greater. And thus, similarly, with the housing 306 installed and the air conditioner 300 fully assembled, the seal provided by IP66 rated electrical connectors is protected from direct water streams, effectively increasing the seal of IP66 rated electrical connectors to that of an IP69 rated seal.

Continuing, in the illustrated embodiment shown in FIG. 11, sheet metal portions in the ambient air exchange cavity 310 are arranged at a downward angle with respect to a plane perpendicular to the wall 382 of the tub 302 (and a vertical direction defined by an enclosure). For example, support trays 386, 396 for the first heat exchanger 308 and the compressor 316, respectively, each extend downward at an angle of at least three degrees. The angled sheet metal portions allow water to drain out of the ambient air exchange cavity 310 after the air conditioner 300 is cleaned (e.g., with a jet of water) and thus reduces the likelihood of standing water within the ambient air exchange cavity 310. The reduction of standing water also reduces the likelihood of bacterial growth within the ambient air exchange cavity 310.

In other embodiments, other configurations are possible. For example, certain features and combinations of features that are presented with respect to particular embodiments in the discussion above can be utilized in other embodiments and in other combinations, as appropriate. In this regard, for example, different configurations of tubs, condensed water coils, and so on, as presented with respect to a particular one of the air conditioners 100, 300 can be implemented in combination with features of any of the other air conditioners 100, 300, or others.

Although the description above has been framed around air conditioners (e.g., the air conditioners 100, 300), it is appreciated that the system described above could be utilized with heaters, blowers, etc. For example, with the appropriate replacement of parts, the air conditioner 100 could be a heater, which could provide heat to the interior volume of the enclosure 200.

Although some of the discussion above is framed in particular around systems, for example, the air conditioner 100 and the enclosure 200, those of skill in the art will recognize therein an inherent disclosure of corresponding methods of use (and installing) of the disclosed systems.

Thus, embodiments of the inventions can provide an improved air conditioner, including for an enclosure that is configured to pass an IP69 standard. More specifically, according to some embodiments of the present disclosure, methods and systems are provided that improve the sealing between an air conditioner and an enclosure, including so as to pass the IP69 standard.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. An air conditioner for solid particle ingress protection and liquid ingress protection for an enclosure having an interior volume accessible via an inlet and an outlet, the air conditioner comprising:
a housing that partly defines an ambient air exchange cavity;
a tub that further defines the ambient air exchange cavity and partly defines a cooling cavity,
the tub supporting:
a first heat exchanger disposed within the ambient air exchange cavity;
a first fan to move air through the ambient air exchange cavity and across the first heat exchanger; and
a second heat exchanger and a second fan disposed within the cooling cavity, the second heat exchanger included in a coolant flow loop with the first heat exchanger and the second fan moves air through the cooling cavity, across the second heat exchanger, and into the inlet of the enclosure, the second heat exchanger is located above the second fan; and
a condensed water coil defining a fluid trap provided below the second heat exchanger to capture and retain condensate from the second heat exchanger and direct the condensate into the ambient air exchange cavity for disposal.

2. The air conditioner of claim 1, wherein, when assembled to the enclosure, the tub is adapted to provide the liquid ingress protection for the cooling cavity when a high pressure-temperature water jet of 8 MPa to 10 MPa and 80° C. is applied to the air conditioner from a distance of 0.10 m to 0.15 m for up to 2 minutes with the water jet being applied at various angles relative to the air conditioner.

3. The air conditioner of claim 1, wherein the tub and the housing are arranged to provide an ingress protection rating of IP69 for the cooling cavity when assembled to the enclosure.

4. The air conditioner of claim 1, further comprising grommets arranged in a wall between the ambient air exchange cavity and the cooling cavity through which the coolant loop passes, the grommets provide the solid particle ingress protection and the liquid ingress protection for the cooling cavity.

5. The air conditioner of claim 4, wherein the grommets provide the liquid ingress protection for the cooling cavity at a level commensurate with being able to withstand a water jet having a flow rate of about 100 L/min, at a pressure of about 100 kPa, from a distance of about 3 m for up to about 3 minutes.

6. The air conditioner of claim 4, wherein the grommets are IP66 rated grommets.

7. The air conditioner of claim 1, wherein the trap provides a seal between the ambient air exchange cavity and the cooling cavity.

8. The air conditioner of claim 7, wherein the trap has a trap height of at least eight inches.

9. The air conditioner of claim 1, further comprising a gasket situated and secured between an exterior surface of a peripheral flange of the tub and the enclosure, wherein the peripheral flange comprises portions of sides of the tub bent inward, welded at respective seams, and machined to make the exterior surface continuous and planar.

10. The air conditioner of claim 1, further comprising:
a plurality of blind nut fastener receivers arranged around the tub for receiving fasteners for securing the tub to the enclosure without entering the cooling cavity.

11. The air conditioner of claim 1, wherein the tub has a peripheral flange formed from portions of sides of the tub bent inward, welded at respective seams, and machined to form a continuous, planar surface and the air conditioner further comprising:
a collar having a plurality of sides and a peripheral flange formed from portions of the plurality of sides directed toward a central region of the collar, welded at respective seams, and machined to provide an interior surface and an exterior surface that are continuous, planar surfaces, the plurality of sides defining a collar cavity;
a first gasket; and
a second gasket;
wherein the tub is received within the collar cavity and the peripheral flange of the tub is coupled to the interior side of the peripheral flange of the collar, with the first gasket situated and secured between the peripheral flange of the tub and the peripheral flange of the collar; and
wherein the second gasket is situated and secured between the exterior side of the peripheral flange of the collar and the enclosure when attached thereto.

12. The air conditioner of claim 1, further comprising:
a tray supporting the first heat exchanger in the ambient air exchange cavity, wherein the tray extends downward at an angle of at least three degrees with respect to a plane perpendicular to a wall of the tub from which the first heat exchanger is supported.

13. An air conditioner for attachment to an enclosure having an interior volume accessible via an inlet and an outlet, the air conditioner comprising:
an ambient air exchange cavity;

a tub adjacent the ambient air exchange cavity, the tub defining a cooling cavity;

a first heat exchanger disposed within the ambient air exchange cavity and positioned on a first tray coupled to a wall of the tub;

a second heat exchanger disposed within the cooling cavity and in a coolant flow loop with the first heat exchanger via passage through a first grommet in the wall;

a second tray disposed below the second heat exchanger to catch condensate falling from the second heat exchanger;

a fluid trap extending downward from the second tray and out of the cooling cavity via passage through a second grommet in the wall into the ambient air exchange cavity and terminating over a third tray; and a fan to move air through the cooling cavity, across the second heat exchanger, and into the inlet of the enclosure, the fan disposed below the second heat exchanger;

the fluid trap having a trap height to retain condensate within the fluid trap when the cooling cavity experiences a negative pressure change.

14. The air conditioner of claim 13, wherein the first and third trays are obliquely angled downward with respect to a plane perpendicular to the wall of the tub.

15. The air conditioner of claim 13, wherein the first and second grommets provide solid particle ingress and liquid ingress protection for the cooling cavity.

16. The air conditioner of claim 15, further comprising a housing that is coupled to the tub and at least partially encloses the ambient air exchange cavity, and, when the air conditioner is washed with a water spray, the housing prevents direct contact of the water spray with the first and second grommets.

17. The air conditioner of claim 13, further comprising a gasket situated and secured between an exterior surface of a peripheral flange of the tub and the enclosure, wherein the peripheral flange comprises portions of sides of the tub bent inward, welded at respective seams, and machined to make the exterior surface continuous and planar, and wherein a seal formed by the gasket provides a dust-tight seal between the tub and the enclosure.

18. An air conditioner for attachment to an enclosure, the air conditioner comprising:

an ambient air exchange cavity with a first heat exchanger;

a cooling cavity adjacent the ambient air exchange cavity with a second heat exchanger in fluid communication with the first heat exchanger; and a fluid drain disposed below the second heat exchanger that captures condensate formed by the second heat exchanger and disposes of the condensate into the ambient air exchange cavity;

wherein the fluid drain has a U-shaped fluid trap that retains the captured condensate within the fluid trap to mitigate the passage of solid particles from the ambient air exchange cavity into the cooling cavity.

19. The air conditioner of claim 18, further comprising a fan disposed within the cooling cavity capable of generating a pressure differential therein;

the fluid trap having a height greater than an altered level of condensate within the fluid trap created by the pressure differential during a spray down procedure in which the cooling cavity experiences a negative pressure change.

20. The air conditioner of claim 18, further comprising a first tray and a second tray in the ambient air exchange cavity to support the first heat exchanger and catch the disposed condensate exiting the fluid drain, respectively, wherein the first and second trays are disposed at an angle downward relative to a plane perpendicular to a wall separating the ambient air exchange cavity from the cooling cavity to drain any liquid landing thereon out of the air conditioner.

* * * * *

UNITED STATES PATENT AND TRADEMARK OFFICE
CERTIFICATE OF CORRECTION

| | |
|---|---|
| PATENT NO. | : 12,048,114 B2 |
| APPLICATION NO. | : 17/718873 |
| DATED | : July 23, 2024 |
| INVENTOR(S) | : Michael Koehler et al. |

It is certified that error appears in the above-identified patent and that said Letters Patent is hereby corrected as shown below:

In the Specification

Column 4, Line 53, "using the the internal" should be --using the Ideal Gas Law the internal--.

Signed and Sealed this
First Day of October, 2024

Katherine Kelly Vidal
Director of the United States Patent and Trademark Office